US008323442B2

(12) United States Patent
Velasquez Urey et al.

(10) Patent No.: US 8,323,442 B2
(45) Date of Patent: Dec. 4, 2012

(54) CARRIER TAPES HAVING TEAR-INITIATED COVER TAPES AND METHODS OF MAKING THEREOF

(75) Inventors: Ruben E. Velasquez Urey, Austin, TX (US); Rocky D. Edwards, Lago Vista, TX (US); Douglas B. Gundel, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 660 days.

(21) Appl. No.: 12/368,457

(22) Filed: Feb. 10, 2009

(65) Prior Publication Data
US 2009/0145543 A1 Jun. 11, 2009

Related U.S. Application Data

(62) Division of application No. 11/835,211, filed on Aug. 7, 2007, now abandoned.

(60) Provisional application No. 60/821,944, filed on Aug. 9, 2006.

(51) Int. Cl.
*B65D 65/28* (2006.01)
(52) U.S. Cl. ...................................... 156/259
(58) Field of Classification Search .............. 156/259
See application file for complete search history.

(56) References Cited

U.S. PATENT DOCUMENTS

| 1,805,533 | A | | 5/1931 | Tomlinson |
| 3,467,250 | A | | 9/1969 | D'Elia et al |
| 4,539,239 | A | | 9/1985 | Graves et al. |
| 4,584,220 | A | | 4/1986 | Melbye |
| 4,878,408 | A | | 11/1989 | Isaacson et al. |
| 4,944,979 | A | | 7/1990 | Gagliano et al. |
| 5,006,856 | A | * | 4/1991 | Benge et al. ............ 340/572.3 |
| 5,027,465 | A | * | 7/1991 | McKay ................ 15/104.002 |
| 5,325,654 | A | | 7/1994 | Juntunen et al. |
| 5,390,472 | A | | 2/1995 | Weiler et al. |
| 5,691,038 | A | | 11/1997 | Hirata et al. |
| 6,027,802 | A | | 2/2000 | Lin |
| 6,383,567 | B2 | * | 5/2002 | Ager et al. ................. 427/282 |
| 2003/0049437 | A1 | * | 3/2003 | Devaney et al. ............ 428/343 |
| 2004/0163482 | A1 | * | 8/2004 | Yamamoto et al. ........ 73/865.8 |
| 2007/0062844 | A1 | | 3/2007 | Velasquez et al. |

FOREIGN PATENT DOCUMENTS

| EP | 0300838 | | 1/1989 |
| EP | 0925715 B1 | | 8/2000 |
| JP | 04-201871 | | 7/1992 |
| JP | 05-213364 | | 8/1993 |
| JP | 05-310264 | | 11/1993 |
| JP | 11-222581 | | 8/1999 |
| JP | 2003-332392 | * | 11/2003 |
| WO | 95/21519 | | 8/1995 |
| WO | 02/085584 A1 | | 10/2002 |

* cited by examiner

*Primary Examiner* — Katarzyna Wyrozebski Lee
*Assistant Examiner* — John Blades
(74) *Attorney, Agent, or Firm* — Robert S. Moshrefzadeh

(57) ABSTRACT

A cover tape for use with a carrier tape, where the cover tape includes at least one tear-initiation feature that defines a predetermined direction of tear to initiate a tear along portions of the cover tape.

4 Claims, 14 Drawing Sheets

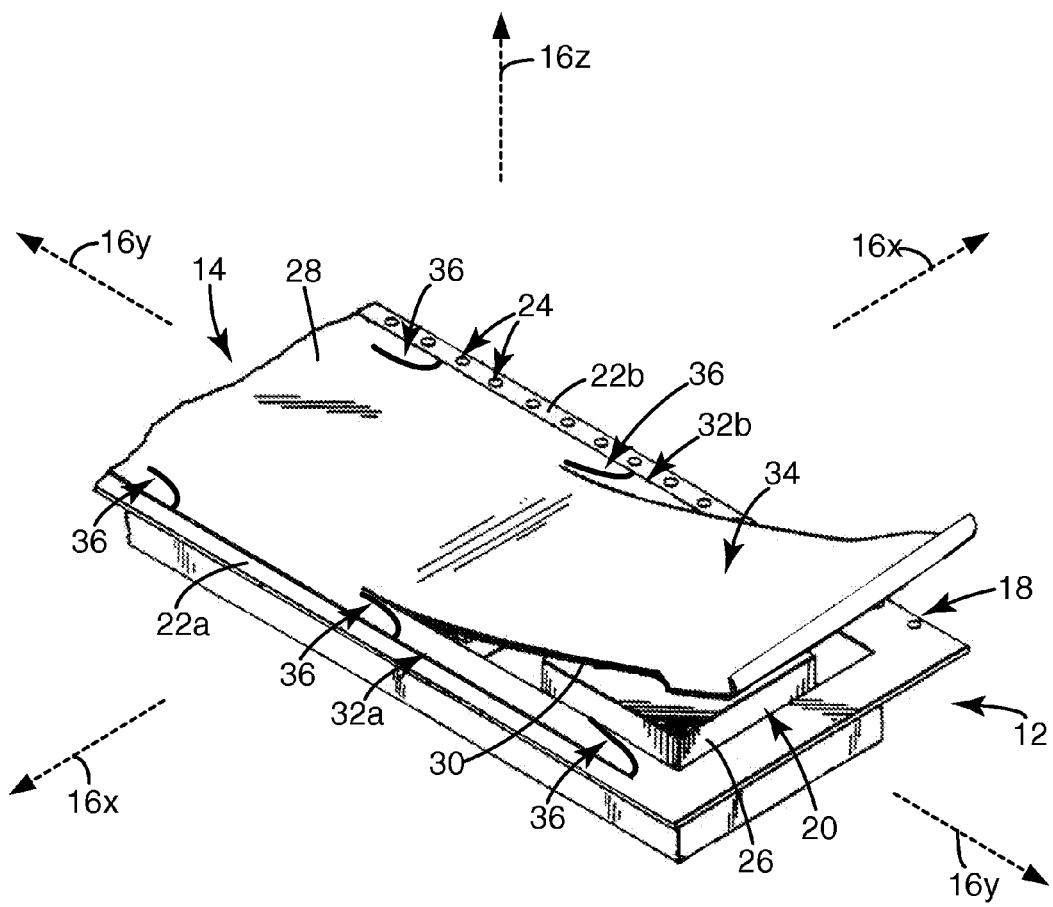

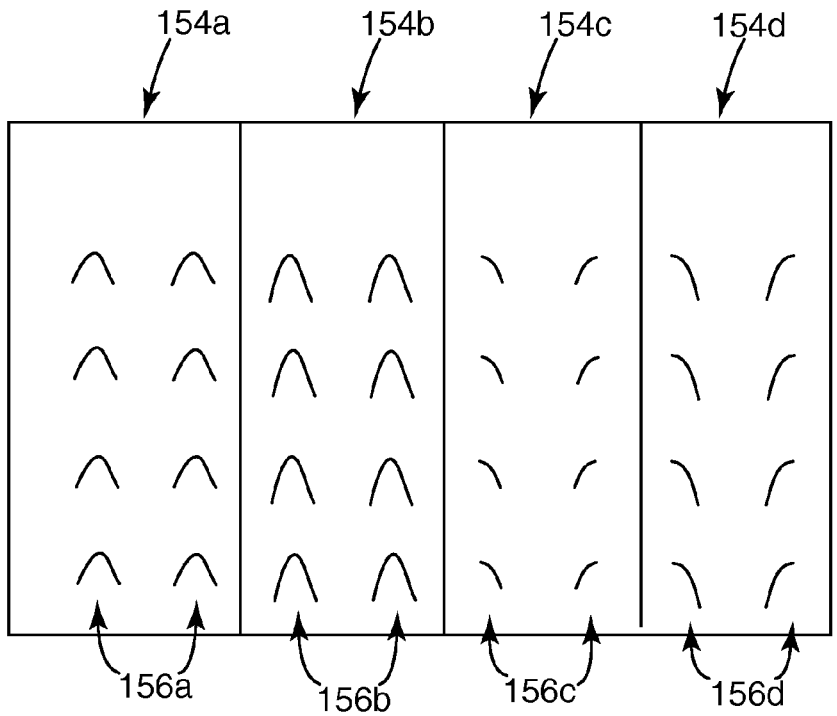
*Fig. 14A*
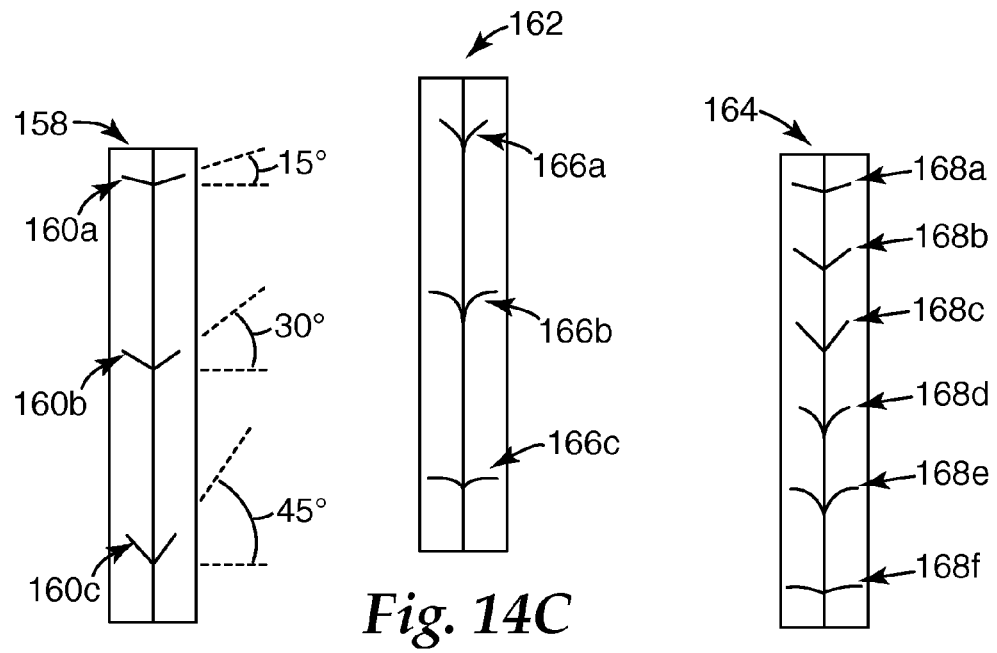
*Fig. 14B*     *Fig. 14C*     *Fig. 14D*

CARRIER TAPES HAVING TEAR-INITIATED COVER TAPES AND METHODS OF MAKING THEREOF

REFERENCE TO CROSS-RELATED APPLICATIONS

This application is a divisional of U.S. Ser. No. 11/835,211, filed Aug. 7, 2007 now abandoned, which claims priority to U.S. Provisional Patent Application 60/821,944, filed Aug. 9, 2006, the disclosure of which is incorporated by reference in its entirety herein.

BACKGROUND

The present invention relates to carrier tapes for storing electronic surface mount components. In particular, the present invention relates to carrier tapes that incorporate cover tapes having tear-initiation features.

During electronic circuit assembly, electronic components are often carried from a supply of such components to a specific location on a circuit board for attachment. One way to provide a continuous supply of electronic components to a desired location is to load a series of such components into pockets that are spaced along a carrier tape. The loaded carrier tape, which is usually provided in roll form, may then be advanced toward a pick-up location at a predetermined rate as each succeeding component is removed from the tape by a robotic placement machine.

Conventional carrier tapes typically include a self-supporting base portion that carries the component, and a flexible cover tape that aids in preventing foreign matter from deleteriously affecting the component. The cover tape is typically sealed to the base portion with a sealing apparatus, and is progressively peeled away from the base portion just before the robotic placement machine removes the component from the carrier tape. However, a common issue with carrier tapes is that the bond between the base portion and the cover tape needs to be sufficient to prevent the cover tape from prematurely delaminating from the base portion, while also being weak enough to allow the cover tape to be readily peeled off from the base portion without requiring excessive removal forces or generating undesirable vibrations. As such, there is a need for cover tapes that exhibit suitable bond strengths to base portions and are also easy to remove when desired.

BRIEF SUMMARY

At least one aspect of the present invention relates to a cover tape for use with a carrier tape. The cover tape includes at least one tear-initiation feature extending through a lateral edge of the cover tape, where the tear-initiation feature at least partially defines a predetermined direction of tear to initiate a tear along portions of the cover tape. In one embodiment, the at least one tear-initiation features has an arcuate shape. In another embodiment, the at least one tear-initiation feature is formed by cutting through the film from a top surface of the film.

At least one aspect of the present invention also relates to a method of forming cover tapes. The method involves cutting at least one track into a film from a first major surface of the film, cutting lines of weakness in the film from a second major surface of the film, applying adhesive materials to the second major surface of the film, and separating the film into multiple cover tapes by slitting the film through the at least one track, thereby forming at least one tear-initiation feature from the at least one divided track.

BRIEF DESCRIPTION OF THE DRAWINGS

FIG. 1 is a perspective view of a carrier tape of an embodiment of the present invention.

FIGS. 14A-14D are top views of multi-layer films formed pursuant to the method shown in FIG. 5, where the multi-layer films depict additional alternative features.

Figure 2A:
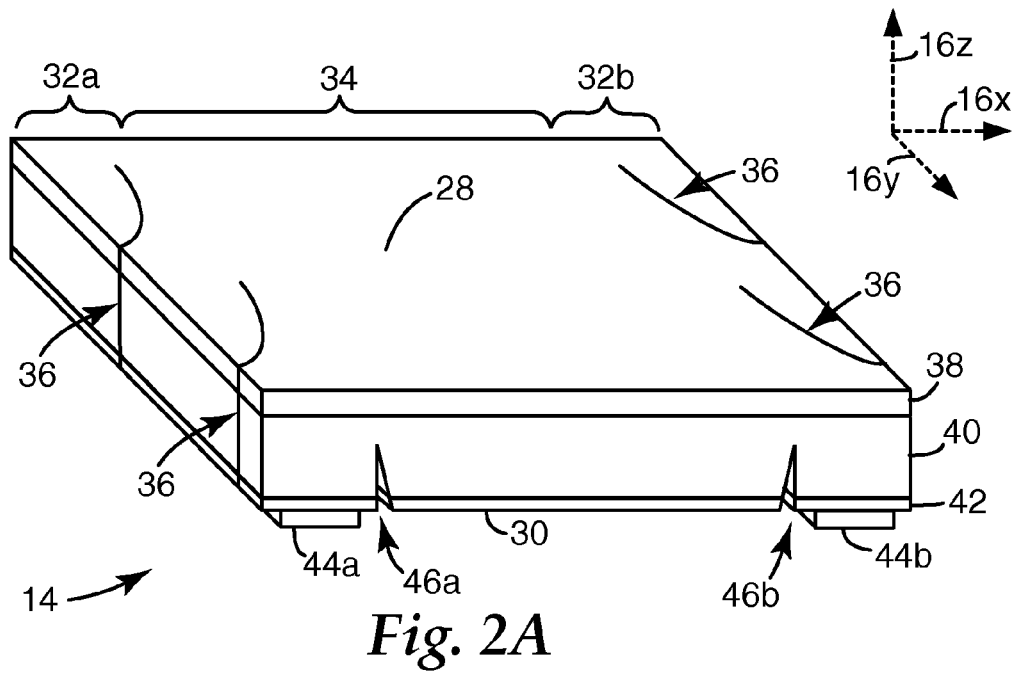
FIG. 2A is a top perspective view of a segment of a cover tape of the carrier tape.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale.

DETAILED DESCRIPTION

FIG. 1 is a perspective view of carrier tape 10, which is a convenient system for storing and transporting electronic components. As shown, carrier tape 10 includes base portion 12 and cover tape 14, and is disposed in a coordinate system that includes lateral axis 16x, longitudinal axis 16y, and vertical axis 16z. The directional orientations are used herein for ease of discussion, and are not intended to be limiting.

Base portion 12 is a flexible, self-supporting structure that extends along longitudinal axis 16y, and includes perimeter surface 18 and pockets 20. Perimeter surface 18 is a planar border extending around pockets 20, and includes edge portions 22a and 22b. Edge portions 22a and 22b each extend along longitudinal axis 16y and are offset along lateral axis 16x. Additionally, lateral edge portion 22b includes a row of aligned advancement holes 24 formed in perimeter surface 18. Advancement holes 24 allow carrier tape 10 to engage with an advancement mechanism (not shown) for advancing carrier tape 10 to a predetermined position during use. Pockets 20 are indentations formed in base portion 12, within perimeter surface 18, which are spaced apart along longitudinal axis 16y. Pockets 20 are designed to conform to the size of the stored electronic components, such as component 26 shown in FIG. 1.

Cover tape 14 is a single layer or multi-layer film that extends along longitudinal axis 16y, and is disposed vertically over perimeter surface 18 and pockets 20 of base portion 12. As such, during storage and transportation, cover tape 14 seals stored electronic components (e.g., component 26) within pockets 20. Cover tape 14 includes top surface 28 and bottom surface 30, which are opposing major surfaces of cover tape 14 offset along vertical axis 16z. Cover tape 14 also includes bonding portions 32a and 32b, and medial portion 34, where medial portion 34 is laterally disposed between bonding portions 32a and 32b. Bonding portions 32a and 32b are the portions of cover tape 14 that are adhered to perimeter surface 18 at edge portions 22a and 22b, respectively. Medial portion 34 is a central portion of cover tape 14 that is configured to be peeled back as shown in FIG. 1 (i.e., separated from bonding portions 32a and 32b) for access to pockets 20.

Cover tape 14 also includes a plurality of tear-initiation features 36, which, in this embodiment, are arcuate-shaped slits extending from top surface 28 toward, and typically through, bottom surface 30 at bonding portions 32a and 32b, and are situated at intermittent locations along longitudinal axis 16y. Tear-initiation features 36 allow medial portion 34 to be readily peeled from bonding portions 32a and 32b, without requiring an excessive amount of removal force. When the cover tape 14 is peeled back from perimeter surface 18 of base portion 12, bonding portions 32a and 32b respectively delaminate from edge portions 22a and 22b of perimeter surface 18 until the peel intersects tear-initiation features 36. At this point, cover tape 14 starts to tear and the tear is directed towards the center of cover tape 14 by the angle and shape of tear-initiation features 36. The tear continues until it runs into score lines (not shown in FIG. 1), which then provide the directions along which cover tape 14 will tear continually.

Tear-initiation features 36 allow cover tape 14 to rely on a tear mechanism rather than an adhesive de-bonding mechanism to peel cover tape 14 from base portion 12. This reduces the need for specialized adhesives to bond cover tape 14 to base portion 12, which otherwise require a balance between adhesion and removal forces. As such, cover tape 14 can be adhered to base portion 12 with strong adhesive forces, while still allowing medial portion 34 to be readily removed with moderate and consistent removal forces.

Figure 2B:
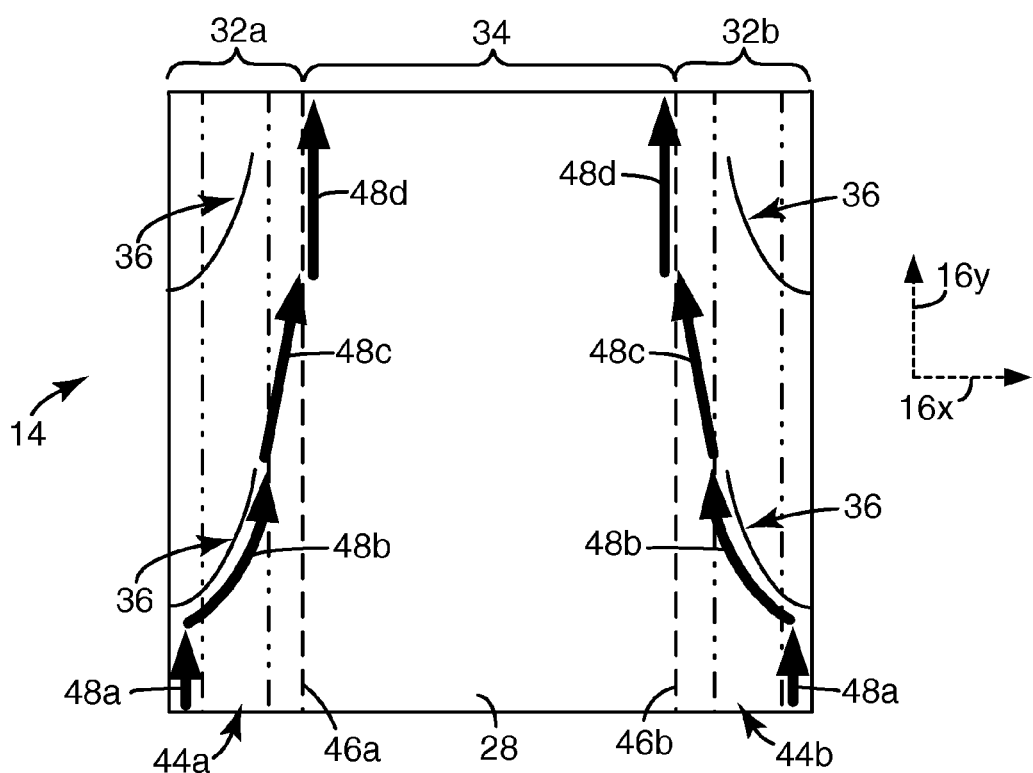
FIG. 2B is a top view of a segment of the cover tape of the carrier tape.

FIGS. 2A and 2B are respectively a top perspective view and a top view of a segment of cover tape 14. According to the embodiment shown in FIG. 2A, cover tape 14 is a multi-layer film that includes topcoat layer 38, core layer 40, bottom coating 42, and adhesive strips 44a and 44b. Core layer 40 is the base layer for cover tape 14, and is desirably uniaxially or biaxially oriented to facilitate downweb tearing along longitudinal axis 16y, and to reduce or prevent transverse tearing along lateral axis 16x. Core layer 40 of cover tape 14 can be a polymer film, for example, polyethylene terephthalate, oriented polypropylene (e.g., biaxially oriented polypropylene), oriented polyamides, oriented polyvinyl chloride, polystyrene, polycarbonate, polyethylene, polyacrylonitrile, polyolefin and polyimide films. Core layer 40 can also be transparent, intrinsically non-conductive, electrically conductive, static dissipative, and combinations thereof. Core layer 40 may be made electrically conductive or static dissipative by compounding materials such as carbon black or metals into the polymer film material that forms core layer 40.

Topcoat layer 38 is optionally provided along top face 28 of cover tape 14. Topcoat layer 38 may be or may include a static dissipative (SD) coating, LAB (i.e., an adhesive release coating), an anti-reflective or glare-reducing coating, and other coatings and combinations of coatings. Topcoat layer 38 may also be a protective layer that protects the cover tape 14 and retained electrical components during storage and transportation. Suitable materials for topcoat layer 28 include weathering and abrasion resistant materials, such as polyurethanes, cross-linked materials (e.g., cured acrylates and epoxies), silicones, silane-conforming materials, and combinations thereof. While topcoat layer 38 is shown across the entire top portion of core layer 40, topcoat layer 38 may alternatively be disposed over one or more smaller portions of core layer 40 (e.g., to align with adhesive strips 44a and 44b when cover tape 14 is rolled up).

Bottom coating 42 is also optionally provided along the bottom face 30 of cover tape 14. Bottom coating 42 can be an SD coating or other type of coating, and can be at least partially blended with core layer 40. Alternatively, a metallized layer, which can dissipate static electricity, may be substituted for bottom coating 42. Suitable materials for a metallized layer include metals such as aluminum, stainless steel, nickel-chrome, and nickel-cadmium, which are applied by vapor coating or sputtering techniques. Additionally, one or both of topcoat layer 38 and core layer 40 may also include metals for dissipating electricity.

While cover tape 14 is shown with the above-discussed layers, in alternative embodiments, cover tape 14 may include different types of functional and non-functional layers as necessary for particular storage applications. In another alternative embodiment, cover tape 14 is a single-layer film that only includes core layer 40. In this embodiment, top surface 28 and bottom surface 30 are the opposing major surfaces of core layer 40. This embodiment is beneficial for reducing material and processing costs in forming cover tape 14.

Adhesive strips 44a and 44b are film-based strips of adhesive materials that are bonded to bottom surface 30 at bonding portions 32a and 32b, respectively. Adhesive strips 44a and 44b extend along longitudinal axis 16y, and are the portions of cover tape 14 that adhere to edge portions 22a and 22b of base portion 12. Suitable materials for adhesive strips 44a and 44b include pressure sensitive adhesives and heat-activated adhesives (e.g., ethylene vinyl acetate copolymers). Upon assembly with base portion 12 (shown above in FIG. 1), adhesive strips 44a and 44b adhere bonding portions 32a and 32b of cover tape 12 to edge portions 22a and 22b of base portion 12.

As further shown in FIG. 2A, cover tape 14 includes score lines 46a and 46b, which are lines of weakness formed in bottom surface 30, and which extend through bottom coating 42 and partially into core layer 40. Score lines 46a and 46b are disposed laterally adjacent to adhesive strips 44a and 44b, respectively, and extend along longitudinal axis 16y. In an alternative embodiment, score lines 46a and 46b extend partially into core layer 40, but are formed before bottom coating 42 is secured to core layer 40. As such, in this embodiment, score lines 46a and 46b do not extend through bottom coating 42. Tear-initiation features 36 extend through topcoat layer 38, core layer 40, and bottom coating 42, and each have an arcuate shape along top surface 28 and bottom surface 30.

As shown in FIG. 2B, score lines 46a and 46b (shown with hidden lines) are disposed laterally inward relative to adhesive strips 44a and 44b (shown with phantom lines). As a result, when the tear of cover tape 14 reaches score lines 46a and 46b, the force required to peel medial portion 34 only needs to exceed the tear force of score lines 46a and 46b. The strength of the adhesive bond at bonding portions 32a and 32b no longer directly affects the required peel force.

As further shown in FIG. 2B, tear-initiation features 36 extend from the lateral edges of cover tape 14 to points laterally inward that are disposed over adhesive strips 44a and 44b. This keeps cover tape 14 anchored to base portion 12, and reduces the risk of cover tape 14 accidentally peeling at a premature point in time (e.g., during storage or transportation). Tear-initiation features 36 also do not intersect score lines 46a and 46b to preserve the structural integrity of cover tape 14.

To obtain access to pockets 20 of base portion 12 (shown above in FIG. 1), a removal force is applied to medial portion 34 of cover tape 14. This initially de-bonds bonding portions 32a and 32b from edge portions 22a and 22b of base portion 12, thereby peeling cover tape 14 from base portion 12 as represented by arrows 48a. Continued application of the removal force causes further de-bonding until the peel reaches the first set of tear-initiation features 36 along longitudinal axis 16y.

When the peel reaches tear-initiation features 36, the peel then follows the arcuate shapes of tear-initiation features 36, thereby moving the peel laterally inward toward the center of cover tape 14 as represented by arrows 48b. When the peel reaches the end of tear-initiation features 36, cover tape 14 then begins to tear in the same direction as the trailing edges of tear-initiation features 36, as represented by arrows 48c. Continued application of the removal force causes the tearing to continue until score lines 46a and 46b are reached. Because score lines 46a and 46b have lower tear strengths, the applied removal force then causes the tear to follow score lines 46a and 46b, as represented by arrows 48d. This separates medial portion 34 away from bonding portions 32a and 32b, while bonding portions 32a and 32b remain adhered to base portion 12.

Figure 3:
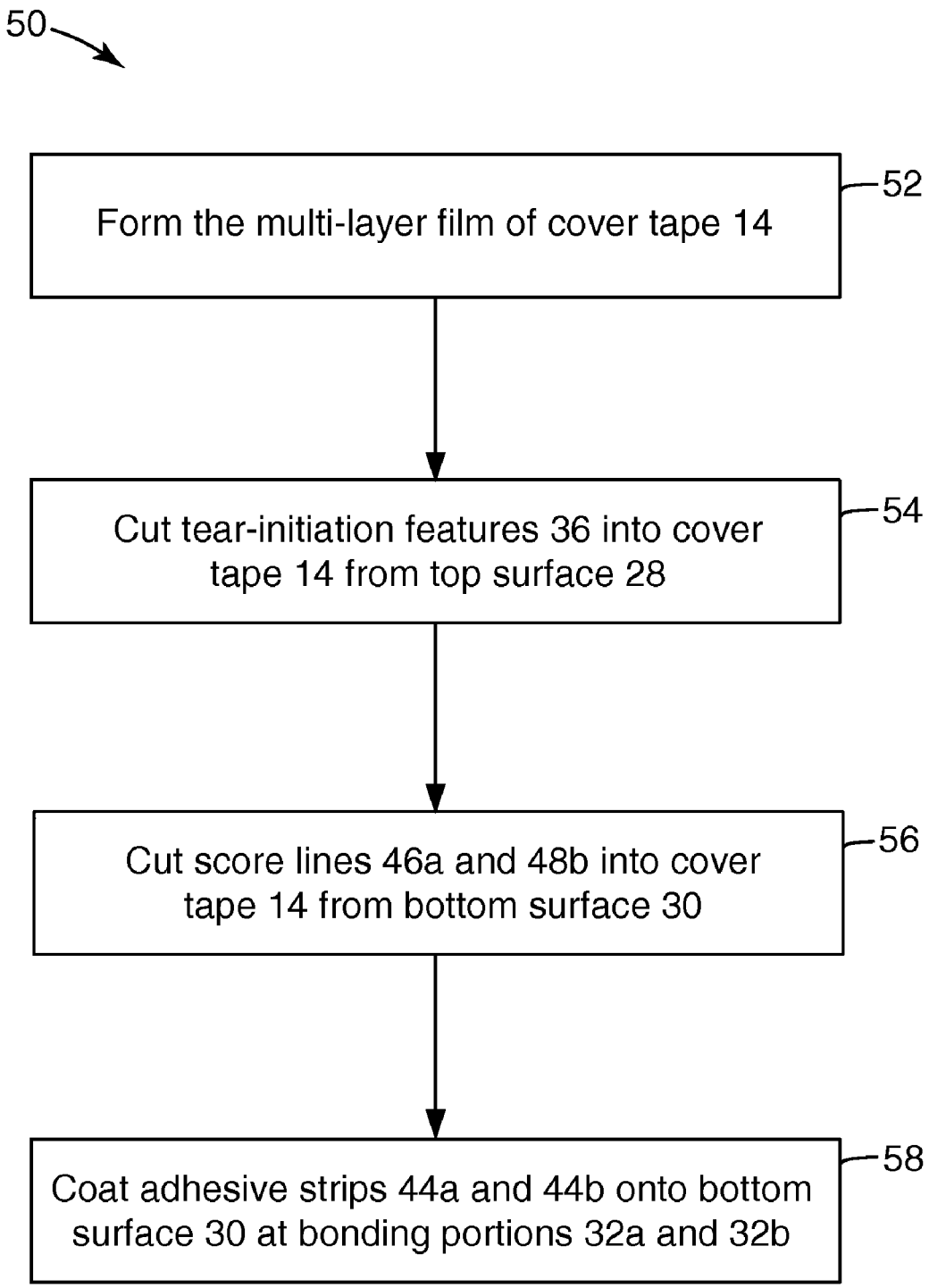
FIG. 3 is a flow diagram of a method of forming the cover tape.

FIG. 3 is a flow diagram of method 50, which is a suitable method for forming cover tape 14. As shown, method 50 includes steps 52-58, and initially involves forming the multi-layer film of cover tape 14 (i.e., topcoat layer 38, core layer 40, and bottom coating 42) (step 52). The layers of cover tape 14 may be formed in a variety of manners, such as co-lamination techniques (e.g., coextrusions and wet castings), deposition techniques (e.g., vapor coatings and sputtering techniques), and combinations thereof.

Tear-initiation features 36 are then cut into the lateral edges of the multi-layer film of cover tape 14 from top surface 28 (step 54). Forming tear-initiation features 36 from top surface 28 reduces the amount of debris contamination on top surface 28, thereby reducing the risk of contaminating guides and sealing shoes of sealing equipment used to seal cover tape 14 to base portion 12.

Once tear-initiation features 36 are formed, score lines 46a and 46b are then cut into cover tape 14 from bottom surface 30 (step 56). Because score lines 46a and 46b do not extend through core layer 40 or topcoat layer 38, score lines 46a and 46b may be cut from bottom surface 30 without forming debris contamination on top surface 28. In an alternative embodiment, score lines extend through topcoat layer 38 and into core layer 40. In this embodiment, the score lines are cut into top surface 28 rather than bottom surface 30. While steps 54 and 56 are described above in the order shown in FIG. 3, steps 54 and 56 may alternatively be formed in an opposite order (i.e., cut score lines 46a and 46b prior to cutting tear-initiation features 36), or in a substantially simultaneous manner.

Once tear-initiation features 36 and score lines 46a and 46b are formed, adhesive strips 44a and 44b are then coated onto bottom surface 30 at bonding portions 32a and 32b (step 58). This may be performed with a standard lamination process. Applying adhesive strips 44a and 44b after tear-initiation features 36 are formed also reduces contamination that may otherwise occur if tear-initiation features 36 are cut after applying adhesive strips 44a and 44b to bottom surface 30. Cutting tear-initiation features 36, from bottom surface 30, after applying adhesive strips 44a and 44b pushes adhesive material through tear-initiation features 36, and out of top surface 28. This also pushes film debris out through top surface 28, where it may potentially collect in the guides and sealing shoes of the tape sealing equipment. Thus, coating adhesive strips 44a and 44b onto bottom surface 30 after tear-initiation features 36 are formed from top surface 28 (or from bottom surface 30) reduces the risk of producing contaminating debris. Additionally, application of adhesive strips 44a and 44b after tear-initiating features 36 have been formed will encapsulate within the adhesive strips any film debris deposited on bottom surface 30 when tear-initiating features 36 were formed.

After cover film 14 is formed, it is then sealed to base portion 12 (after electrical components are placed in pockets 20) to form carrier tape 10. Suitable sealing systems for sealing cover film 14 to base portion 12 include systems commercially available from Ismeca USA, Inc., Carlsbad, Calif.

Figure 4A:
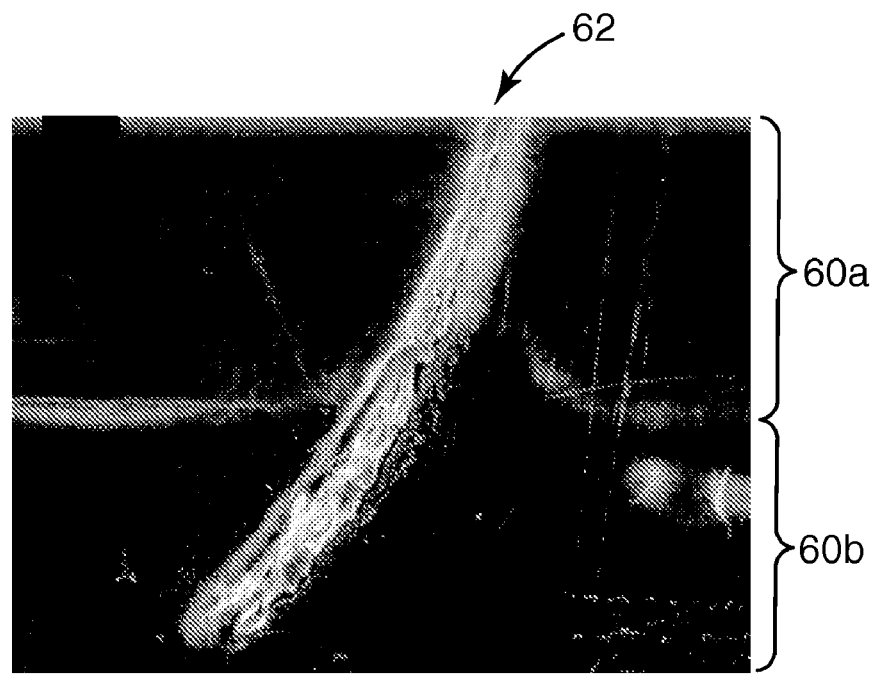
FIG. 4A is a top view photograph taken of a cover tape containing a tear-initiation features formed after an adhesive strip was applied.
Figure 4B:
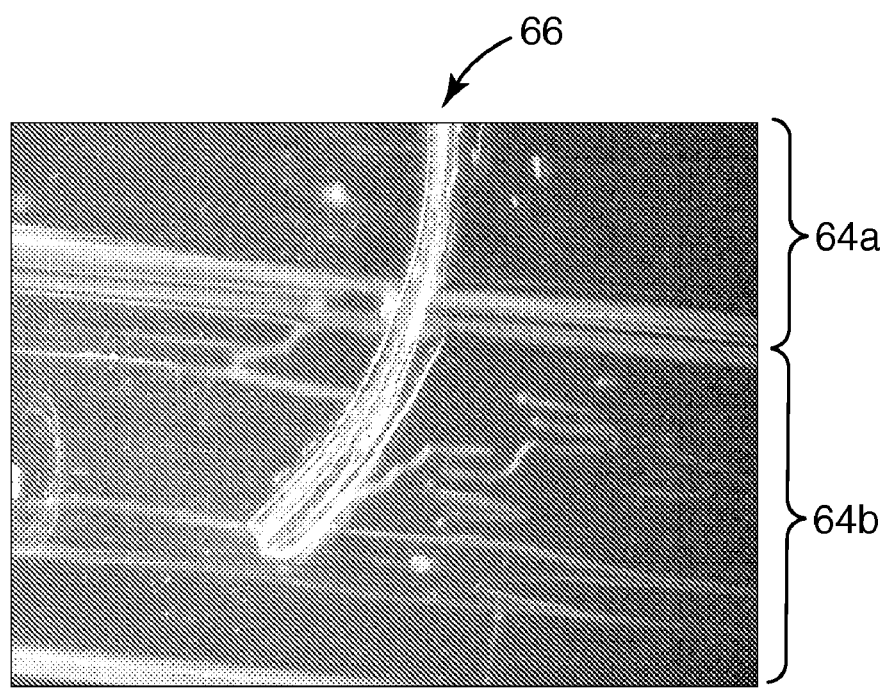
FIG. 4B is a top view photograph taken of a cover tape containing a tear-initiation features formed before an adhesive strip was applied.

FIGS. 4A and 4B are top view photographs taken of cover tapes containing tear-initiation features (taken with 20× magnification). In the example shown in FIG. 4A, the cover tape includes portions 60a and 60b, and tear-initiation feature 62. Portion 60a is a portion of the multi-layer film adjacent a lateral edge of the cover tape, and portion 60b is a portion where an adhesive strip is disposed below the multi-layer film. As shown, tear-initiation feature 62 extends through portion 60a, and has a trailing end that terminates in portion 62b (i.e., above the adhesive strip).

In this example, tear-initiation feature 62 was cut into the multi-layer film from bottom surface 30 after the adhesive strip was applied to bottom surface 30, thereby forming tear-initiation feature 62 through the adhesive strip as well. Because of this, the section of tear-initiation feature 62 that extends into portion 60b is spread apart, and adhesive material is pushed upwards through tear-initiation feature 62. The penetration of the cutting blade through the adhesive strip pushes the adhesive away from the area of tear-initiation feature 62, thereby causing a small region with insufficient adhesive. This area has a reduced adhesive bond to the corresponding base portion, and is a potential point of delamination, which can result in shut downs and damage to the sealing equipment.

In the example shown in FIG. 4B, the cover tape includes portions 64*a* and 64*b*, and tear-initiation feature 66, which correspond to portions 60*a* and 60*b*, and tear-initiation feature 62 (shown above in FIG. 4A). In contrast to the example shown in FIG. 4A, tear-initiation feature 66 was cut into the multi-layer film from top surface 28 before the adhesive strip was applied. As shown, the section of tear-initiation feature 66 that extends into portion 64*b* is cleanly cut and no adhesive is pushed upwards. Thus, forming tear-initiation feature 66 from top surface 28 (or from bottom surface 30) prior to applying the adhesive strips reduced the amount of contaminating adhesive and debris formed on the top surface of the cover tape. In addition, most of the debris created when forming tear-initiation feature 66 was captured or encapsulated by the adhesive strip, thereby making it cleaner. Furthermore, debris in the region of the adhesive strip did not appear to reduce the adhesive strength of the adhesive strip.

Figure 5:
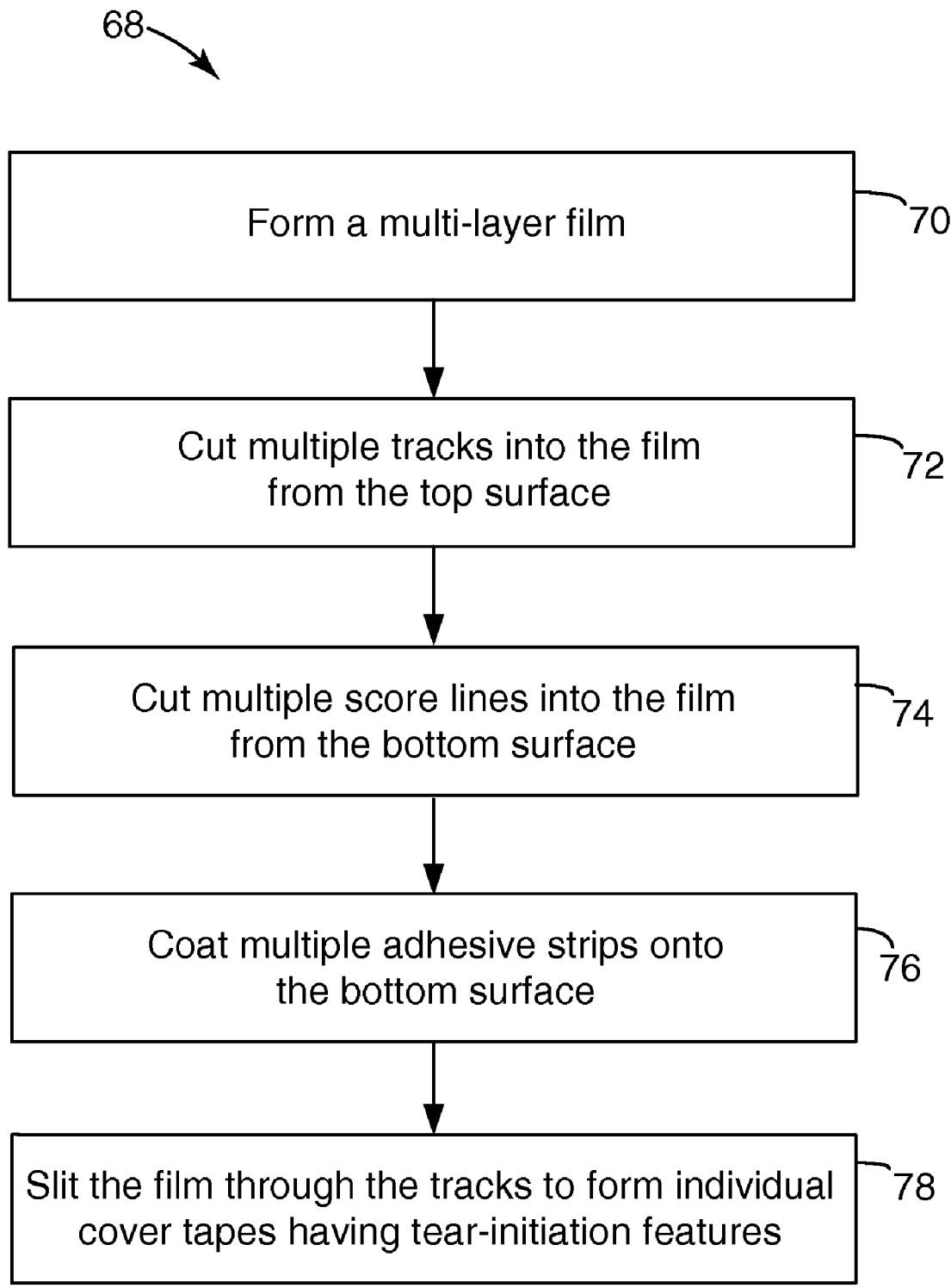
FIG. 5 is a flow diagram of a method of forming multiple cover tapes in a simultaneous manner.

FIG. 5 is a flow diagram of method 68, which is a suitable method for forming multiple cover tapes simultaneously. As shown, method 68 includes steps 70-78, and initially involves forming a multi-layer film containing the layers of the cover tapes (step 70). The multi-layer film may be formed using the same techniques discussed above in step 52 of method 50 (shown above in FIG. 3). Multiple tracks are then cut into the multi-layer film from the top surface of the film (step 72). Multiple score lines are then cut into the multi-layer film from the bottom surface of the film (step 74). In an alternative embodiment, score lines are cut into the multi-layer film from the top surface of the film. While steps 72 and 74 are described above in the order shown in FIG. 5, steps 72 and 74 may alternatively be formed in an opposite order (i.e., cut the score lines prior to cutting the tracks), or in a substantially simultaneous manner. After the tracks and score lines are formed, multiple adhesive strips are then coated onto the bonding portions of the bottom surface of the film (step 76). Finally, the film is separated into the multiple cover tapes by slitting the film through the tracks (step 78). As discussed further below in FIG. 6, slitting the film between the adhesive strips (and through the tracks) bisects each of the tracks, thereby forming a pair of rows of tear-initiation features on the lateral edges of each cover tape.

Figure 6:
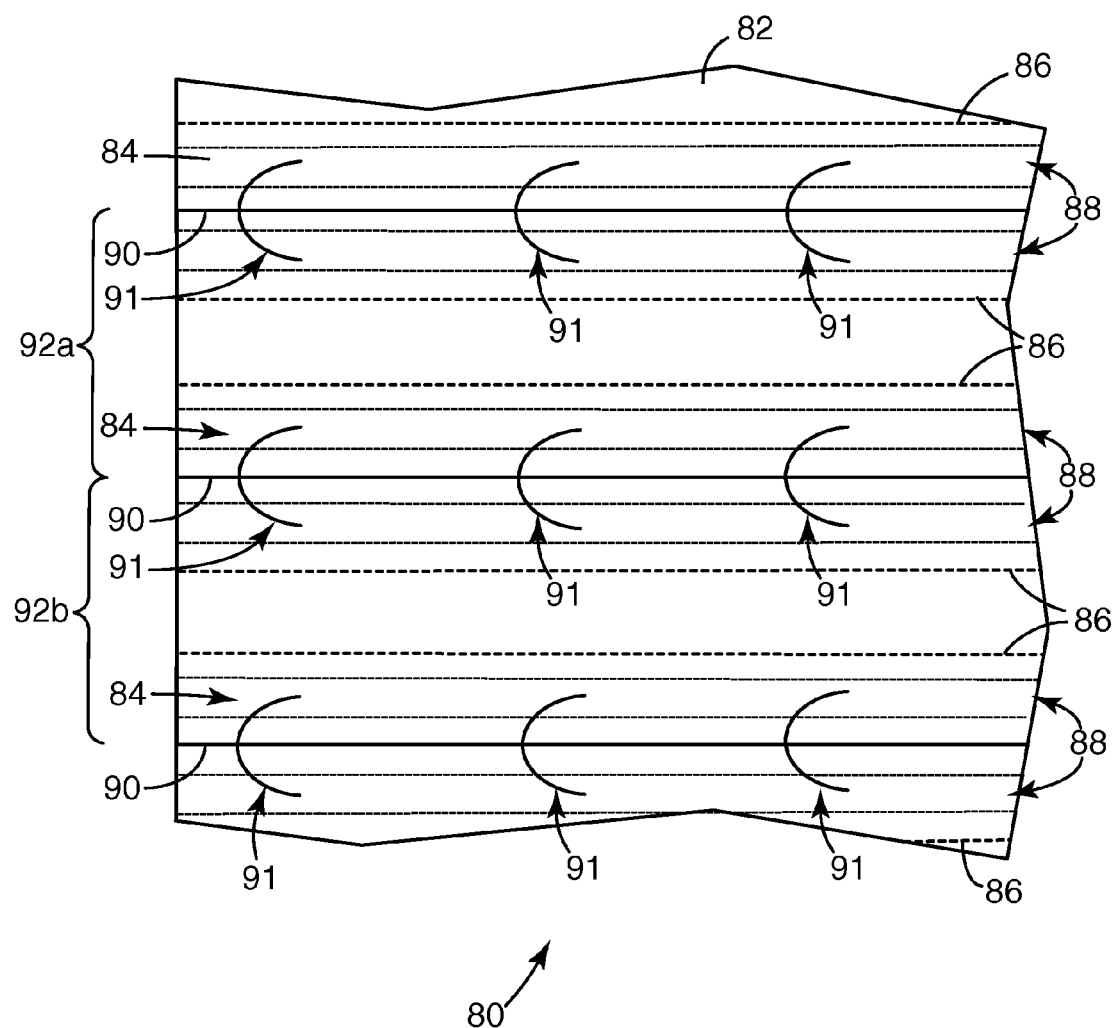
FIG. 6 is a top view of a multi-layer film formed pursuant to the method shown in FIG. 5.

FIG. 6 is a top view of film 80, which is a multi-layer film formed pursuant to step 70 of method 68. Film 80 includes top surface 82, tracks 84, score lines 86 (shown with hidden lines), adhesive strips 88 (shown with hidden lines), and slit lines 90. As discussed above, multiple tracks 84 are cut into top surface 82, pursuant to step 72 of method 68. As shown, tracks 84 are rows of "U"-shaped features 91, where each "U"-shaped feature 91 is subsequently divided to form a pair of arcuate-shaped tear-initiation features. As such, this allows a single cutting blade to form tear-initiation features for a pair of adjacent cover tapes. The distance along film 80 between "U"-shaped features 91 may vary depending on the particular sizing requirements of the resulting cover tapes. Suitable separation distances include at least about 0.1 inches, with more suitable distances typically ranging from about 0.5 inches to about 3 inches. Suitable lateral widths of "U"-shaped features 91 include at least about 0.1 millimeters, with more suitable widths typically ranging from about 0.5 millimeters to about 2.0 millimeters. In one embodiment, the multi-layer film includes a single "U"-shaped features 91. As discussed above, forming tear-initiation features from top surface 82 (and also prior to applying adhesive strips 88) reduces the amount of contaminating debris that forms on top surface 82.

Multiple score lines 86 are then cut in multi-layer film 80 from the bottom surface (not shown in FIG. 6), pursuant to step 74 of method 68. As shown, score lines 86 are disposed laterally beyond "U"-shaped features 91, and beyond the intended locations of adhesive strips 88. Adhesive strips 88 are then coated onto the bottom surface of multi-layer film 80, pursuant to step 76 of method 68. At this point multi-layer film 80 includes multiple repeating patterns containing tracks 84, score lines 86, and adhesive strips 88. Multi-layer film 80 is then separated into multiple cover tapes (e.g., cover tapes 92*a* and 92*b*) by slitting film 80 along slit lines 90, pursuant to step 78 of method 68. As shown in FIG. 6, slit lines 90 bisect tracks 84, thereby separating each "U"-shaped feature 91 into a pair of arcuate-shaped tear-initiation features that extend from each lateral edge of the separated cover tapes.

Method 68 shown above in FIG. 5 and discussed in FIG. 6 is an efficient technique for forming multiple cover tapes from a single multi-layer film. The number of cover tapes that may be prepared pursuant to method 68 will vary depending on the lateral width of film 80, the desired lateral widths of the cover tapes, and on the lateral widths of the cutting dies.

Tracks 84 may be cut into film 80 in a variety of manners. For example, cutting may be performed with one or more blades, a blade burst, a rotary die, a stamping die, or combinations thereof. In one embodiment, a sealing shoe of a standard sealing apparatus is modified with small blades to function as a rotary die. In this embodiment, tracks 84 are cut into a cover tape (e.g., cover tape 92*a*) from top surface 82 after adhesive strips 88 are applied. When tracks 84 are formed after the adhesive strips are applied, the sealing shoe is desirably treated so that adhesive strips 88 do not stick to the sealing shoe (e.g., Teflon, plasma, and other lubricants). As cover tape 92*a* is positioned above a base portion corresponding to base portion 12 (shown above in FIG. 1), cover tape 92*a* and the base portion pass through the sealing shoe. The sealing shoe then seals cover tape 92*a* to the base portion and cuts tracks 84 into cover tape 92*a* in a substantially simultaneous manner. Because the cutting process occurs during the sealing process, the adhesive material does not press through the formed features before the sealed portion of cover tape 92*a* exits the sealing shoe. As such, the concern for contaminating debris is reduced.

In an alternative embodiment, a cutting die (corresponding to a rotary die or a stamping die) may be located on one of the multiple idler rollers that feed cover tape 92*a* to the sealing shoe, thereby cutting tracks 84 into cover tape 92*a* just before cover tape 92*a* is sealed to the base portion. In additional alternative embodiments, different types of cutting mechanisms may be used to cut tracks 84 into multi-layer film 80. Examples of suitable alternative cutting mechanisms include laser-cutting systems, rotating blades, and ultrasound-cutting systems.

Figure 7:
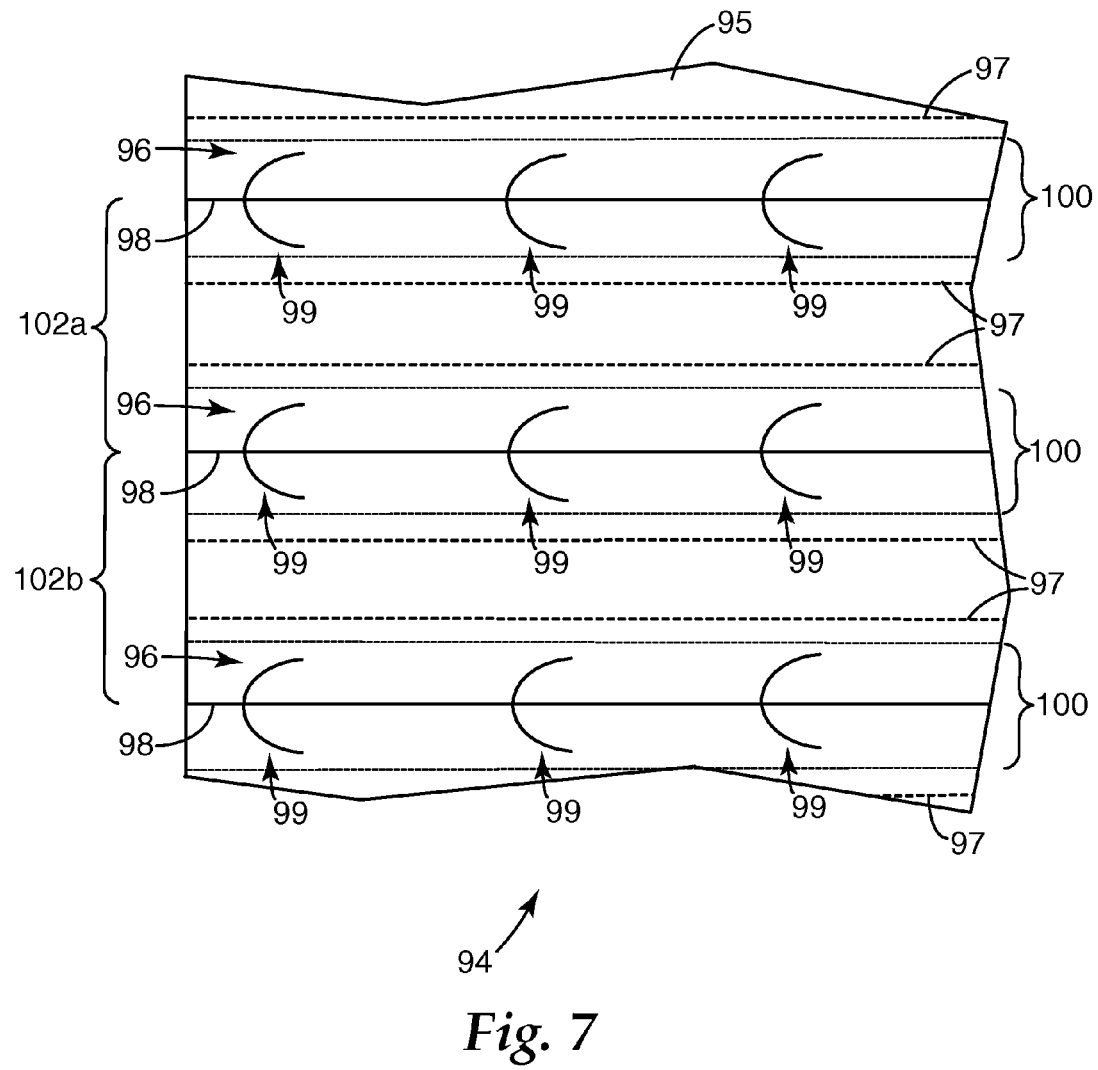
FIG. 7 is a top view of an alternative multi-layer film formed pursuant to the method shown in FIG. 5.

FIG. 7 is a top view of multi-layer film 94, which is also a multi-layer film formed pursuant to step 70 of method 68. Film 94 includes top surface 95, tracks 96, score lines 97 (shown with hidden lines), slit lines 98, and "U"-shaped feature 99, which are the same as top surface 82, tracks 84, score lines 86, slit lines 90, and "U"-shaped feature 91, as shown above in FIG. 6. As shown in FIG. 7, film 94 also includes adhesive strips 100 (shown with hidden lines), which extend across slit lines 90 and encompass tracks 96. Film 94 is separated into multiple cover tapes by slitting film 94 along slit lines 98, pursuant to step 78 of method 68. As shown in FIG. 7, slit lines 98 bisect tracks 84 and adhesive strips 100. As such, each "U"-shaped feature 99 is separated into a pair of arcuate-shaped tear-initiation features, and each adhesive strip 100 is separated into a pair of adhesive strips that extend from each lateral edge of the separated cover tapes.

Figure 8A:
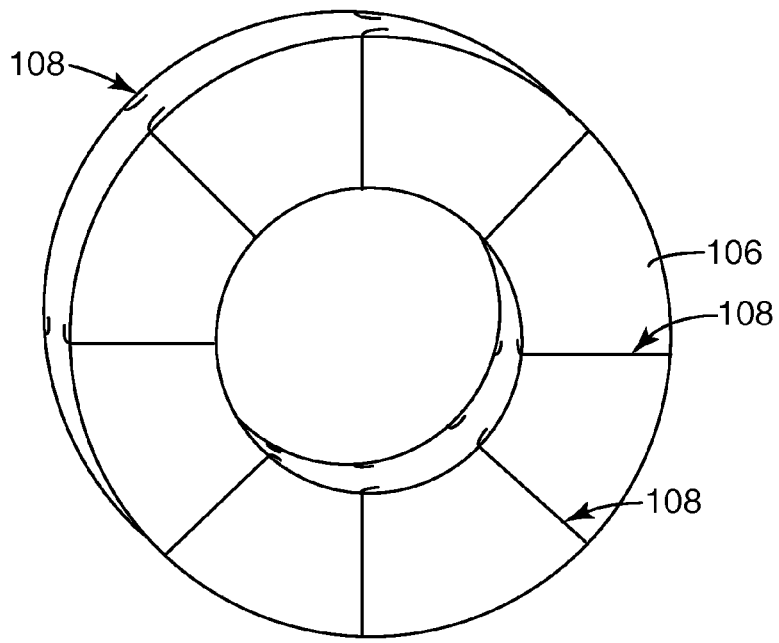
FIG. 8A is a side perspective view of a wound-up roll of cover tape that illustrates an alternative method for forming tear-initiation features.
Figure 8B:
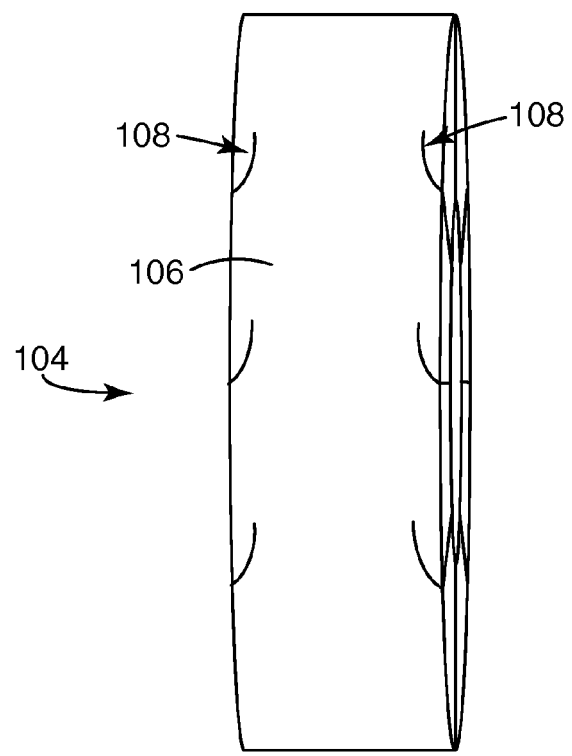
FIG. 8B is a front perspective view of the wound-up roll of cover tape.

FIGS. 8A and 8B are respectively a side perspective view and a front perspective view of roll 104, which is a wound roll of cover tape 106 that includes score lines (not shown) and tear-initiation features 108. To better illustrate tear-initiation features 108, the layers of cover tape 106 on roll 104 are not shown in the figures. Cover tape 106 may be formed pursuant to method 68 (shown above in FIG. 5), except that step 72 (cutting the tracks) is omitted prior to separating the multi-layer film into individual cover tapes (e.g., cover tape 106). In this embodiment, tear-initiation features 108 are formed by cutting tear-initiation features 108 into the lateral sides of roll 104. As such, this embodiment is suitable for forming tear-initiation feature in existing (e.g., commercially available) cover tapes. This allows the existing cover tapes to be opened in a desired direction with the use of tear-initiation features.

One or more groups of tear-initiation features formed by a single blade may be cut at a time. Alternatively, the cutting may be performed with a cutting mechanism that holds multiple blades angled in the proper direction, thereby cutting all tear-initiation features 108 into one of the lateral sides of roll 104 in a single cutting motion. This embodiment is beneficial because tear-initiation features 108 can be cut in every layer of roll 104 with minimal equipment. Because most rolls (e.g., roll 104) are wound with good accuracy, a pre-set depth of a blade will cut all the layers within reasonable tolerances. Nonetheless, exemplary samples of cover tapes formed in this manner initiated a tear even when the tear-initiation features were not cut to the exact desired depth. As such, the cutting-depth tolerances for tear-initiation features 108 allow for processing variations.

While a number of tear-initiation features 108 disposed around roll 104 are desirable to ensure that there is always a tear initiation feature 108 in case the cover tape is cut, a single cut on a lateral side of roll 104 is sufficient to form tear initiation features 108 for use. A single set of tear initiation features 108 is beneficial for placing a tear initiation feature 108 at the beginning of the sealed reel so a customer can readily initiate the tear. This also improves the strength and integrity of cover tape 106.

Figure 9A:
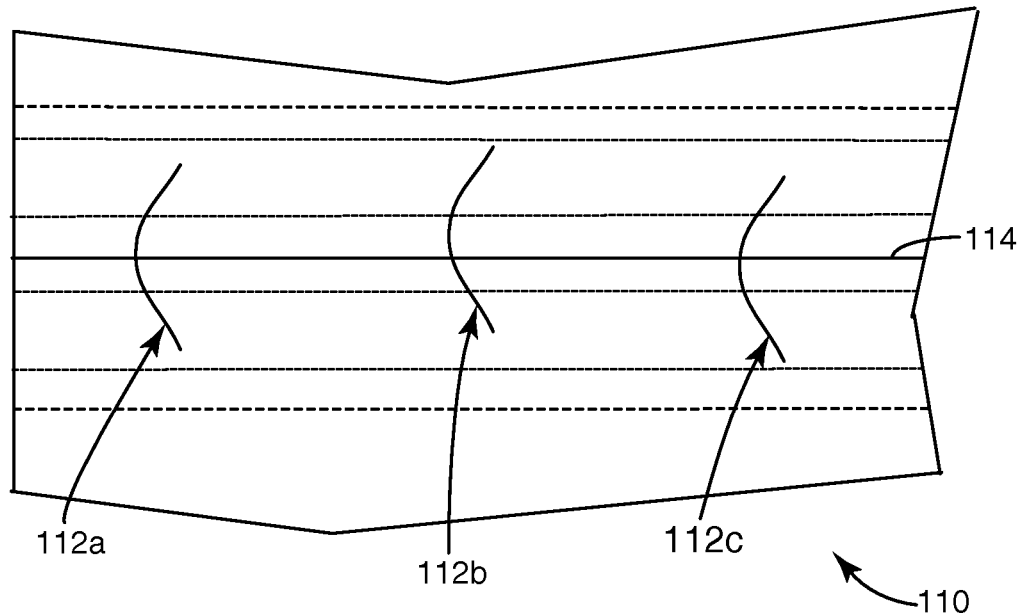
FIG. 9A is a top view of a multi-layer film formed pursuant to the method shown in FIG. 5, where the multi-layer film has a first alternative "U"-shaped feature.
Figure 9B:
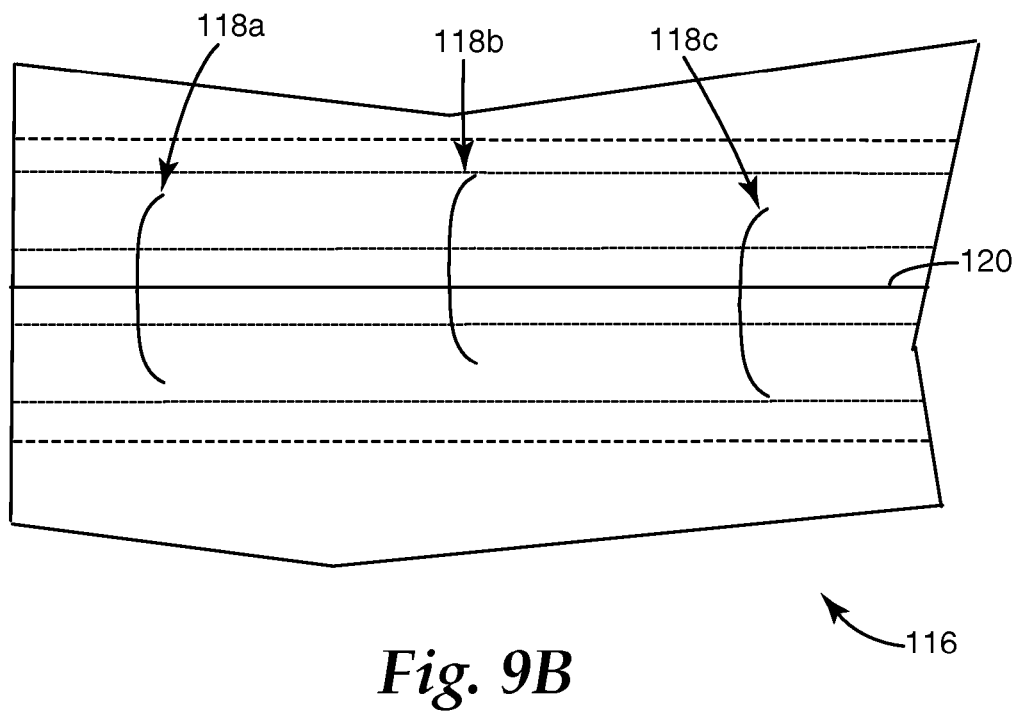
FIG. 9B is a top view of a multi-layer film formed pursuant to the method shown in FIG. 5, where the multi-layer film has a second alternative "U"-shaped feature.

FIGS. 9A and 9B are top views of multi-layer films, each of which depict alternative "U"-shaped features that may be formed pursuant to the step 72 of method 68 (shown above in FIG. 5). As shown in FIG. 9A, film 110 includes features 112a-112c and slit line 114, where features 112a-112c are sharper than "U"-shaped features 91 (shown above in FIG. 6). The terms "sharp", "sharper", and the like refer to "U"-shaped features that have narrow, angular apexes that cause the features to resemble "V"-shapes. The "U"-shaped features may also be more rounded so that they are semi-circular or between a "U" shape and a semi-circular shape.

As shown, feature 112a is centered around slit line 114, feature 112b is laterally offset upward in the view shown in FIG. 9A, and feature 112c is laterally offset downward in the view shown in FIG. 9A. Because of this offsetting, and because of the sharp "U"-shapes, slit line 114 does not intersect features 112b and 112c at the apexes of the "U" shapes. As a result, when the cover tapes are separated along slit line 114, the resulting divided tear-initiation features are uneven. Nonetheless, the sharp "U"-shapes create a sharp point having little surface area for the cover tape, which tends to lift when stressed (e.g., when wound in a roll after the cover tape is sealed to a bottom portion). Accordingly, features 112a-112c reduce the risk of cover tape lifting, which is undesirable and can cause equipment shut downs.

As shown in FIG. 9B, film 116 includes features 118a-118c and slit line 120, where features 118a-118c are flatter than "U"-shaped features 91 (shown above in FIG. 6), and slit line 120. The terms "flat", "flatter", and the like refer to "U"-shaped features that have broad, extended apexes. The flatter shapes of features 118a-118c reduce the need to accurately center features 118a-118c around slit line 120. As shown, feature 118a is centered around slit line 120, feature 118b is laterally offset upward in the view shown in FIG. 9B, and feature 118c is laterally offset downward in the view shown in FIG. 9B. Nonetheless, because features 118a-118c have flat "U"-shapes, when the cover tapes are separated along slit line 120, the resulting tear-initiation features each extend from the lateral edges of the cover tapes in the same directions. As such, the tear forces required to peel the cover tapes from the offset tear-initiation features (i.e., features 118b and 118c) are substantially the same as those for centered tear-initiation features (i.e., feature 118a). Therefore, the use of flat features, such as features 118a-118c, allows for greater accuracy tolerances for aligning with slit line 120. Furthermore, the flat "U"-shapes also allows for a greater surface contact area with the adhesive materials, thereby reducing the risk of cover tape lifting.

Figure 10:
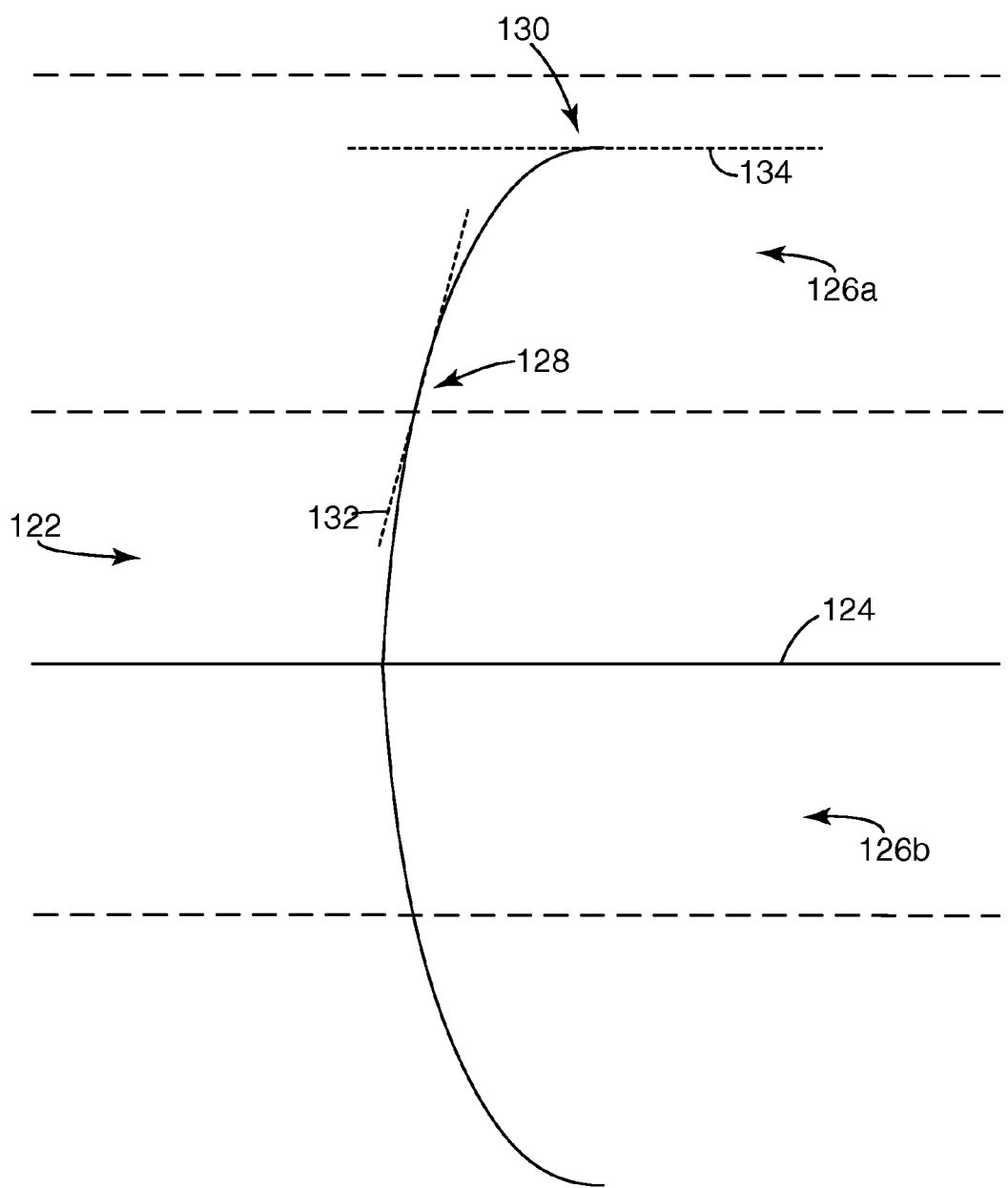
FIG. 10 is an expanded view of a U"-shaped feature formed pursuant to the method shown in FIG. 5.

FIG. 10 is an expanded view of feature 122, which is a "U"-shaped feature formed pursuant to step 72 of method 68 (shown above in FIG. 5). As shown in FIG. 10, feature 122 is divided along slit line 124 to form individual, arcuate-shaped tear-initiation features 126a and 126b, which are disposed on adjacent cover tapes. As used herein, the term "arcuate" refers to a curved shape of a tear-initiation feature (e.g., tear-initiation feature 122a), where a leading end of the tear-initiation feature adjacent the edge of the cover tape (shown as leading end 128) is oriented in a different direction than a trailing end of the tear-initiation feature (shown as trailing end 130). Because of the curvature of tear-initiation feature 126a, the directions of leading end 128 and trailing end 130 may be determined by the tangents of tear-initiation feature 126a at the leading end 128 and trailing end 130 (shown as tangent lines 132 and 134, respectively). Accordingly, a tear-initiation feature is defined as being arcuate if a first tangent line at the leading end (i.e., tangent line 132) is oriented in a different direction than a second tangent line at the trailing end (i.e., tangent line 134). In one embodiment, the term "arcuate" includes shapes that have corner angles.

Figure 11:
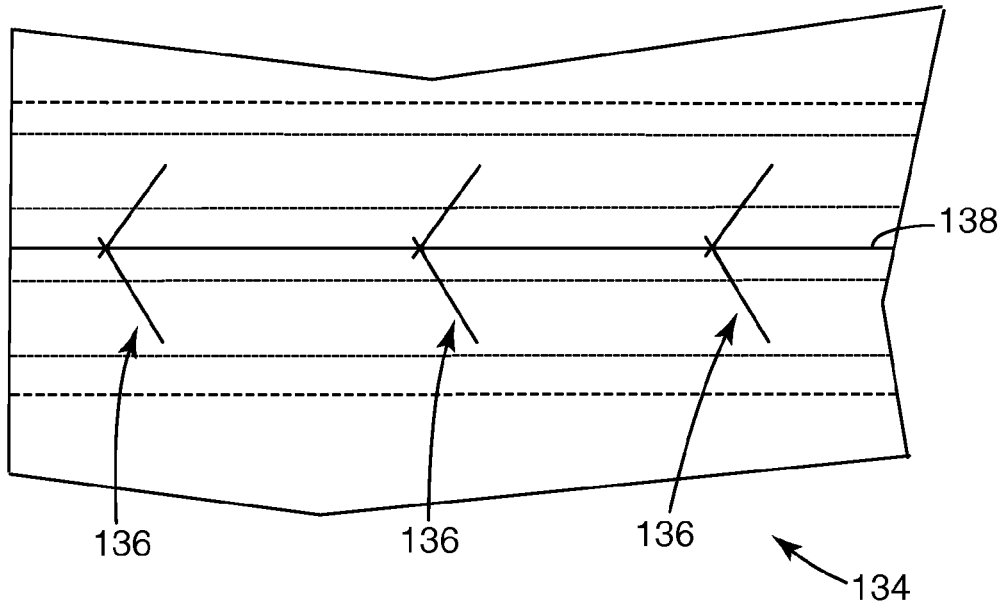
FIG. 11 is a top view of a multi-layer film formed pursuant to the method shown in FIG. 5, where the multi-layer film has a first alternative, non-arcuate feature.
Figure 12:
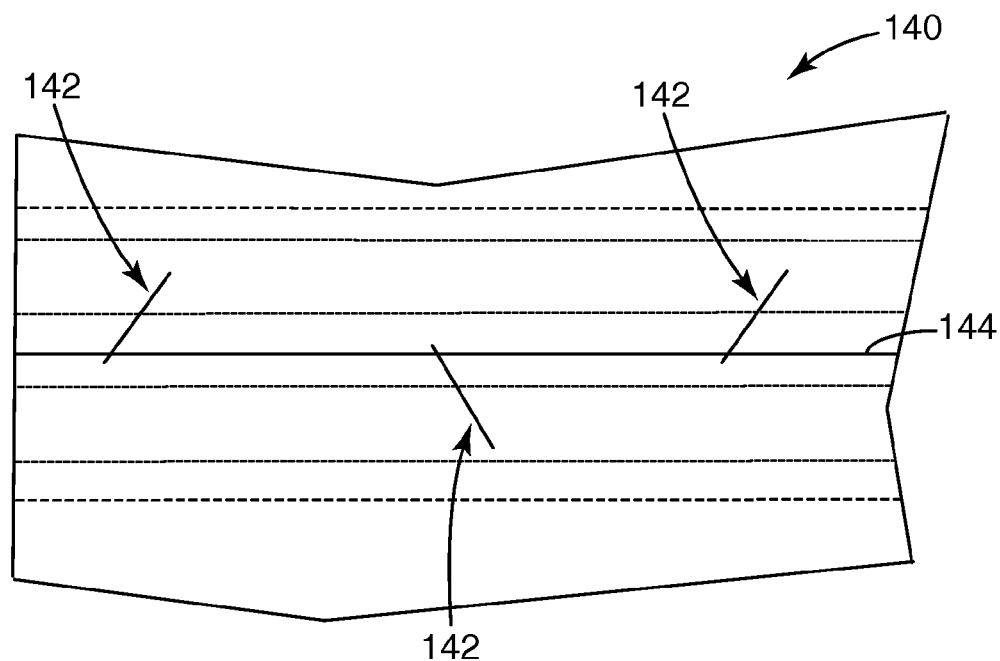
FIG. 12 is a top view of a multi-layer film formed pursuant to the method shown in FIG. 5, where the multi-layer film has a second alternative, non-arcuate feature.

FIGS. 11 and 12 are top views of multi-layer films, each of which depict alternative, non-arcuate features that may be formed pursuant to the step 72 of method 68 (shown above in FIG. 5). As shown in FIG. 11, film 134 includes "V"-shaped track features 136 and slit line 138, where each feature 136 has a corner angle apex centered around slit line 138. As a result, when the cover tapes are separated along slit line 138, the resulting tear-initiation features, defined by the track features, are linear notches extending at the same angle from the edges of the cover tapes. As shown in FIG. 12, film 140 includes notch track features 142 and slit line 144, where each notch feature extends from slit line 144. In this embodiment, when the cover tapes are separated along slit line 144, the resulting tear-initiation notch features 142 separate along with each cover film.

Figure 13:
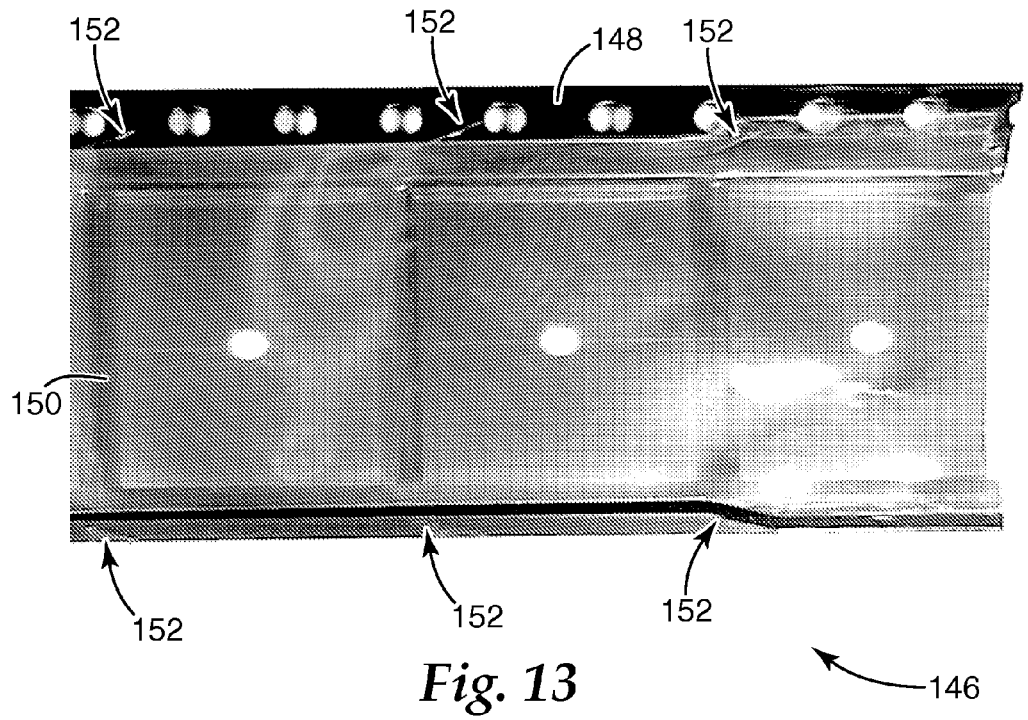
FIG. 13 is a top view photograph of a carrier tape, which includes a cover tape having non-arcuate tear-initiation features.

FIG. 13 is a top view photograph of carrier tape 146, which includes base portion 148 and cover tape 150. Cover tape 150 includes notch features 152, which are tear-initiation features that may be formed with films 134 and 140 (shown above in FIGS. 11 and 12). As discussed above, notch features 152 are formed by cutting the film from the top surface, prior to applying the adhesive strips. This reduces the risk of forming contaminating debris on the top surface of the film.

FIGS. 14A-14D are top views of multi-layer films, each of which depict additional alternative features that may be formed pursuant to the step 72 of method 68 (shown above in FIG. 5). As shown in FIG. 14A, films 154a-154d each include different tracks cut into the films (shown as tracks 156a-156d). Tracks 156a-156d illustrate the wide variety of tracks and tear-initiation features that are suitable for use with the present invention. FIG. 14B shows film 158 with features 160a-160c, where features 160a-160c are cut into film 158 to form notch features that extend at varying angles (ranging from about 15° to about 45°). FIGS. 14C and 14D show films 162 and 164, respectively, which respectively include features 166a-166c and features 168a-168f. As shown, features 166a-166c and features 168a-168f are inverted from the "U"-shape features shown above in FIG. 14A. As such, features 166a-166c and features 168a-168f exhibit triangular or pyramidal shapes that extend at varying angles. When features 166a-166c and features 168a-168f are divided, however, the resulting tear-initiation features are arcuate shaped, and function in the same manner as those discussed above.

Figure 15A:
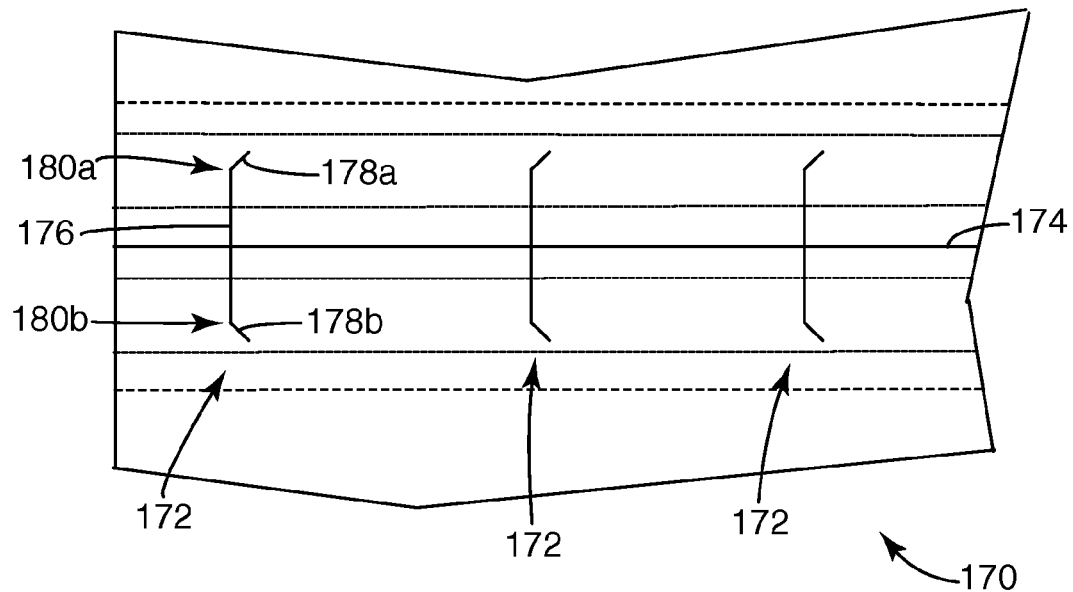
FIG. 15A is a top view of a multi-layer film formed pursuant to the method shown in FIG. 5, where the multi-layer film has a "U"-shaped feature with a linear apex portion and linear trailing ends.
Figure 15B:
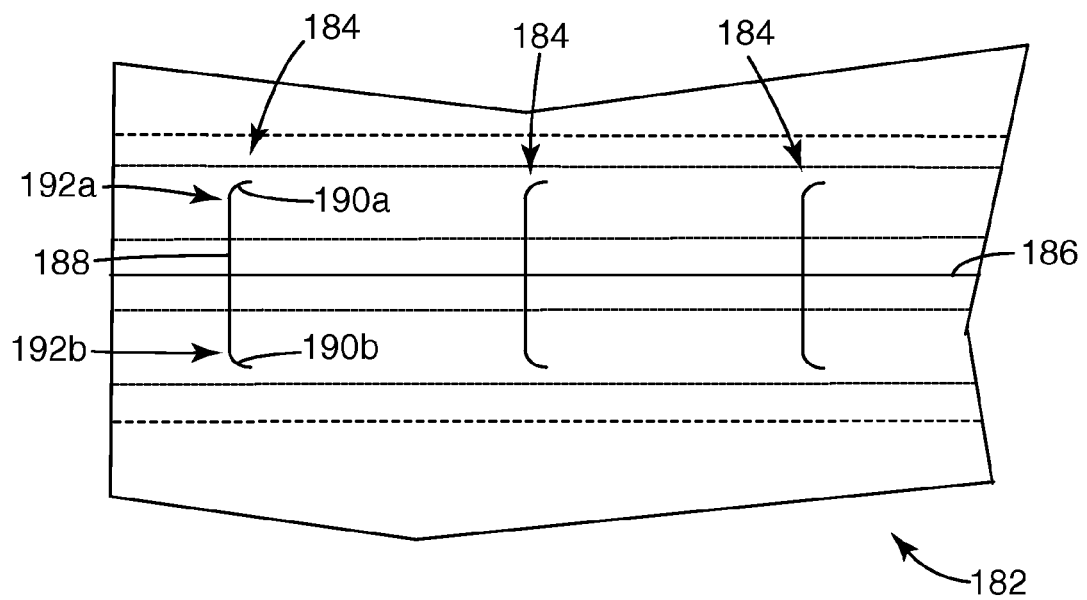
FIG. 15B is a top view of a multi-layer film formed pursuant to the method shown in FIG. 5, where the multi-layer film has a "U"-shaped feature with a linear apex portion and curved trailing ends.

FIGS. 15A and 15B are top views of multi-layer films, each of which depict additional alternative "U"-shaped features that may be formed pursuant to the step 72 of method 68 (shown above in FIG. 5). As shown in FIG. 15A, film 170 includes features 172 and slit line 174, where features 172 includes linear apex portion 176 and linear trailing ends 178a and 178b. As shown, linear trailing ends 178a and 178b extend from linear apex portion 176 at corner angles 180a and 180b, respectively.

As shown in FIG. 15B, film 182 includes features 184 and slit line 186, where features 184 includes linear apex portion 188 and curved trailing ends 190a and 190b. As shown, curved trailing ends 190a and 190b extend from linear apex portion 188 at corners 192a and 192b, respectively. Features 172 and 184 are further illustrative of the variety of different features that may used pursuant the present invention.

Figure 16:
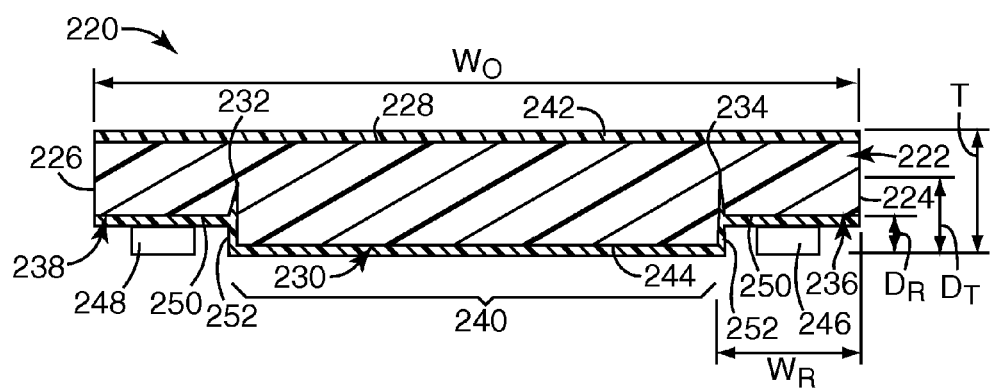
FIG. 16 is a cross-sectional view of a cover tape having recessed portions.

FIG. 16 is a cross-sectional schematic view of another embodiment of a cover tape of the present invention having recessed portions. The cover tape 220 includes an elongate film 222 that has opposed longitudinal edges 224 and 226, and opposed top and bottom faces 228 and 230, respectively. Longitudinally extending tear enabling features 232 and 234 and longitudinally extending recesses 236 and 238 are located relative to the bottom face 230 of the film 222. The tear enabling features 232 and 234 are spaced apart, and a central portion 240 of the film 222 is defined therebetween. A top coating 242 is optionally provided along top face 228 of film 222. A bottom coating 244 is also optionally provided along the bottom face 30 of the film 22. Longitudinally disposed adhesive stripes 246 and 248 are provided along the recesses 236 and 238.

The recesses 236 and 238 are located at the longitudinal edges 224 and 226, respectively, of the film 222. The recesses 236 and 238 are each open facing the bottom face 230 and longitudinal edges 224 and 226, respectively, of the film 222. Alternatively, recesses may be formed on both surfaces of the cover tape. This feature would be useful, for example, if the thicknesses of the adhesive stripes are greater than depth $D_R$, because it would facilitate winding of the cover tape.

In the embodiment shown in FIG. 16, a bottom portion 250 and a side portion 252 define each of the recesses 236 and 238. The adhesive stripes 246 and 248 can be disposed on the bottom portions 250 of the recesses 236 and 238, respectively. The bottom portions 250 of the recesses 236 and 238 can have microtexture (not shown in FIG. 16) for better adhering the adhesive stripes 246 and 248 to the film 222. It should be recognized that other recess shapes can be utilized, so long as the recesses 236 and 238 are open facing an adjacent elongate edge 224 or 226 of the film 222 and the bottom face 230 of the film 222.

The film 222, including recesses 236 and 238 and any microtextures, can be formed using processes such as scoring, extrusion, calendaring, micro-replication, laser ablation, ultrasound, die cutting, chemical etching, and stripping. In further embodiments, the recesses 236 and 238 can be formed using different processes.

The adhesive stripes 246 and 248 on bottom portion 250 of recesses 236 and 238 can be, for instance, pressure sensitive adhesives (PSAs), heat activated and microencapsulated adhesives. The adhesive stripes 246 and 248 can have thicknesses greater than, less than or equal to a depth $D_R$ of the recessed areas 236 and 238. Typically, the thickness is less than or equal to depth $D_R$. The adhesive stripes 246 and 248 have widths equal to or less than widths $W_R$ of the recessed areas 236 and 238. Having widths less than widths $D_R$ of recessed areas 236 and 238 provides substantially adhesive-free zones longitudinally extending along the bottom portions 250 of the recesses 236 and 238 on either side of each of the adhesive stripes 246 and 248 when the cover tape 220 is not applied to a surface (i.e., is not under tension).

The tear enabling features 232 and 234 are located relative to the bottom face 230 of the film 222, and can be located adjacent the recesses 236 and 238 at the side portions 252 thereof. However, in further embodiments, the tear enabling features 232 and 234 can be located nearly anywhere along the top face 228, bottom face 230, or both faces of the film 222, so long as they are each spaced from the longitudinal edges 224 and 226 of the film 222. As shown in FIG. 16, the tear enabling features 232 and 234 are continuous scoring lines that extend longitudinally along film 222. Such scoring lines can be formed by cutting into the film 222 (e.g., with lasers, die cutters, and blades, for instance, according to the blade scoring procedure described below). In further embodiments, the tear enabling features 232 and 234 can be weakened regions of the film 222 (e.g., interfaces of different materials, thinner regions, microperforations, etc.), a transition between two materials (e.g., a first material comprises central portion 240 of the film 222 and a second material comprises the region of the film 222 between the bottom portions 250 of the recesses 236 and 238 and the top face 228), or other structures that facilitate tearing.

In one embodiment, provided by way of example and not limitation, the cover tape 220 can have the following dimensions. An overall width $W_O$ of the film 222 (measured between elongate edges 224 and 226) is about 1 inch (2.54 cm). A thickness T of the film 222 is about 2 mil (0.0254 mm) (measured at the thickest portion of the central region 240 of the film 222). The recesses 236 and 238 each have a width $W_R$ of about 0.0393701 inch (1 mm) and a depth $D_R$ of about 0.5 mil (0.0127 mm). The tear enabling features 232 and 234 are score lines each having a depth of about 1.5 mil (0.0381 mm) (measured from the bottom face 230 of the film 222). It should be recognized that dimensions of the cover tape 220 can vary, as desired. For instance, a width of the central portion 240 of the film 222 can be selected such that it is at least as wide as the pockets of a carrier tape with which the cover tape 220 is used.

Other embodiments of cover tapes having recesses are disclosed in co-pending U.S. patent application Ser. No. 11/228,956, which is incorporated herein by reference.

Although the present invention has been described with reference to preferred embodiments, workers skilled in the art will recognize that changes may be made in form and detail without departing from the spirit and scope of the invention.

The invention claimed is:

1. A method of forming multiple cover tapes, the method comprising:
   forming a film having first and second major surfaces;
   cutting rows of tracks through the first and second major surfaces of the film;
   cutting a plurality of score lines in the second major surface of the film between the rows of tracks;
   coating the second major surface with a plurality of adhesive strips that overlap portions of the rows of tracks; and
   separating the film into sections to form the multiple cover tapes, wherein two adjacent cover tapes are formed by bisecting a row of tracks such that the two adjacent cover tapes have tear-initiation features defined by the bisected tracks.

2. The method of claim 1, wherein the tear-initiation features have arcuate shapes.

3. The method of claim 1, wherein the tracks are cut from the first major surface of the film.

4. The method of claim 1, wherein cutting the plurality of tracks occurs prior to coating the second major surface with the adhesive strips.

* * * * *